United States Patent [19]

Miller et al.

[11] 4,057,315

[45] Nov. 8, 1977

[54] CIRCUIT BOARD PIN

[75] Inventors: Norman Jay Miller, East Petersburg; John Anthony Zemaitis, Tower City; Russell Lloyd Zimmerman, Etters, all of Pa.

[73] Assignee: E. I. Du Pont de Nemours and Company, Wilmington, Del.

[21] Appl. No.: 710,617

[22] Filed: Aug. 2, 1976

[51] Int. Cl.[2] .......... H05K 1/18

[52] U.S. Cl. .......... 339/221 R

[58] Field of Search .......... 339/17 R, 17 C, 217 R, 339/220, 221, 252

[56] References Cited

U.S. PATENT DOCUMENTS

| | | | |
|---|---|---|---|
| 3,670,294 | 6/1972 | Johnson et al. | 339/221 M |

FOREIGN PATENT DOCUMENTS

| | | | |
|---|---|---|---|
| 1,640,336 | 9/1970 | Germany | 339/220 R |
| 2,435,461 | 2/1975 | Germany | 339/221 R |

*Primary Examiner*—Roy Lake
*Assistant Examiner*—Neil Abrams

[57] ABSTRACT

A round circuit board pin with an expanded mounting portion has a plurality of deformed segments alternatively spaced from each other in opposite quadrants along a length of the mounting portion. There are rows of wedge shaped voids between the segments and the voids in adjacent rows are staggered.

4 Claims, 4 Drawing Figures

Fig. 1
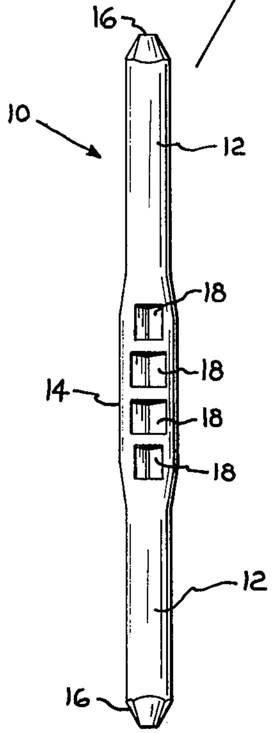
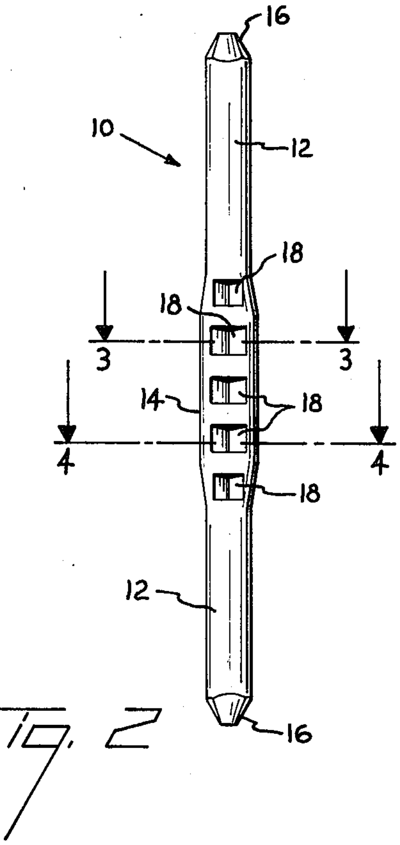
Fig. 2
Fig. 3
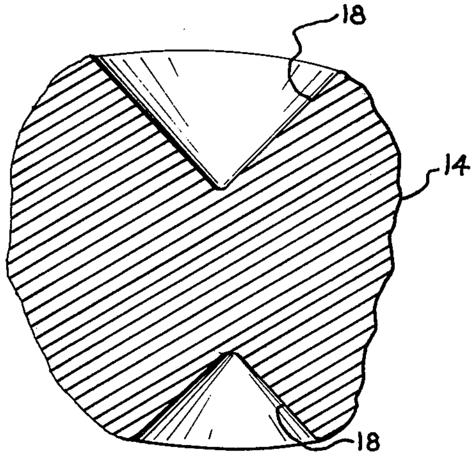
Fig. 4
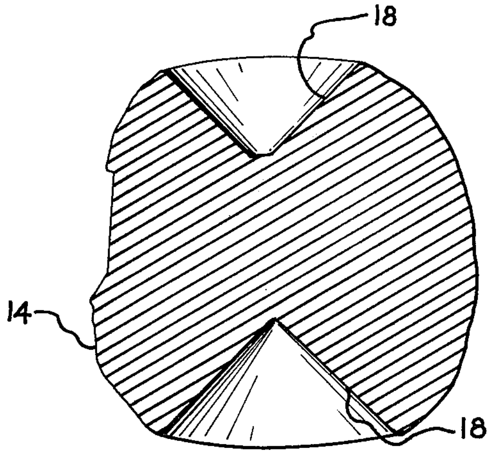

CIRCUIT BOARD PIN

BACKGROUND OF THE INVENTION

1. Field of the Invention

The present invention relates to circuit board pins and particularly relates to circuit board pins having an expanded mounting portion for insertion in a hole in a circuit board. More particularly, the present invention relates to a round, circuit board pin having an expanded mounting portion for insertion in a dielectric bushing, seated in an aperture in a metal plate.

2. Description of the Prior Art

Circuit board pins having deformed mounting portions for mounting a metal plate in a hole in a circuit board are described in Evans, U.S. Pat. No. 3,634,819; Lynch, U.S. Pat. No. 3,780,433; and van den Heuvel, U.S. Pat. No. 3,827,004. A circuit board pin having a star-shaped, deformed mounting portion is described in Bulletin 105, Berg Electronics Division, E. I. du Pont de Nemours and Company, New Cumberland, Pennsylvania, 17070. Additional circuit board contacts having deformed mounting portions for retention in dielectric blocks are described in Straus, U.S. Pat. No. 3,395,377 and Lagne, U.S. Pat. No. 3,862,792.

However, none of the above-described circuit board pins or contacts has the desired retention force when mounted in a dielectric bushing seated in an aperture in a metal plate.

SUMMARY OF THE INVENTION

According to the present invention, a round circuit board pin having an expanded mounting portion is provided. The expanded mounting portion has plural equispaced rows of wedge shaped voids, each with an apex substantially parallel to the axis of the pin. The voids in adjacent rows are staggered and there are at least three voids in each row. The surface of the mounting portion is defined by deformed segments between the voids.

BRIEF DESCRIPTION OF THE DRAWINGS

FIG. 1 is a front elevation view of a preferred embodiment of a circuit board pin according to the invention.

FIG. 2 is a side elevation view of the embodiment of FIG. 1.

FIG. 3 is a cross-section view taken along line 3—3 of FIG. 2.

FIG. 4 is a cross-section view taken along line 4—4 of FIG. 2.

DETAILED DESCRIPTION OF A PREFERRED EMBODIMENT

A preferred embodiment of the present invention is described below with reference to the attached drawings wherein the same numerals are used throughout to identify the same elements.

A circuit board pin 10 according to the invention comprises a pair of end segments 12 and an expanded mounting portion 14. Each end segment 12 includes a tapered lead-in tip 16. The expanded mounting portion 14 is generally cylindrical in cross-section along its length and has a plurality of wedge shaped voids 18 between deformed segments that define its surface. Each pair of opposing voids 18 is in an opposite quadrant of the mounting portion 14 and adjacent pairs are alternately spaced along a length of the mounting portion 14 less than the height of each void 18 so that adjacent pairs overlap, i.e., the voids 18 in alternate rows are staggered. This provides a substantially uniform, generally cylindrical cross-section along the length of the mounting portion. There are five voids 18 in one opposed pair of rows and four voids in each of the other rows. The voids at the ends of the longer rows provide a transition or lead-in at each end of the mounting portion for insertion in a bushing seated in an aperture in a metal plate. Preferably, as illustrated, the mounting portion 14 will include five and four pairs of voids in opposite quadrants alternately spaced in staggered overlapping relationship along a length of the mounting portion and should have at least four and three voids in adjacent rows. As illustrated in FIGS. 3 and 4, the cross section of the deformed segments between opposed rows of voids 18 is irregularly shaped and includes a large number of asperities which enhance the retention forces in a dielectric bushing, e.g. a nylon bushing, seated in an aperture in a metal plate.

What is claimed is:

1. An elongated round circuit board pin having an expanded mounting portion characterized by an irregular surface defined by segments between plural equispaced longitudinal rows of wedge shaped voids, each void having a pair of inwardly directed walls meeting at a longitudinal apex substantially parallel to the axis of the pin, the voids in adjacent rows being staggered, there being at least three voids in each row at least one void in each row longitudinally overlapping a pair of voids in an adjacent row.

2. A circuit board pin, as recited in claim 1, there being four rows of voids, the voids in alternate rows being opposed.

3. A circuit board pin, as recited in claim 2, said mounting portion being generally cylindrical, there being one more void in each of two opposed rows than in adjacent rows, thereby presenting a transitional lead-in at each end of the mounting portion.

4. A circuit board pin, as recited in claim 3, said surface including asperities.

* * * * *